(12) United States Patent
Raeisi et al.

(10) Patent No.: US 12,699,153 B2
(45) Date of Patent: Aug. 4, 2026

(54) METHOD FOR SIGNAL SUPPRESSION BY INCREASING ENTROPY AND QUANTUM ALGORITHM

(71) Applicant: Foqus Technologies Inc., Kitchener (CA)

(72) Inventors: Sadegh Raeisi, Toronto (CA); Michele Mosca, Waterloo (CA)

(73) Assignee: Foqus Technologies Inc., Toronto (CA)

( * ) Notice: Subject to any disclaimer, the term of this patent is extended or adjusted under 35 U.S.C. 154(b) by 185 days.

(21) Appl. No.: 18/781,211

(22) Filed: Jul. 23, 2024

(65) Prior Publication Data

US 2024/0377480 A1      Nov. 14, 2024

Related U.S. Application Data

(63) Continuation of application No. PCT/CA2023/050655, filed on May 12, 2023.

(60) Provisional application No. 63/342,138, filed on May 15, 2022.

(51) Int. Cl.
*G01R 33/00* (2006.01)
*G06N 10/40* (2022.01)

(52) U.S. Cl.
CPC ......... *G01R 33/0029* (2013.01); *G06N 10/40* (2022.01)

(58) Field of Classification Search
CPC .......................... G01R 33/0029; G01R 33/46; G01R 33/5607; G06N 5/01; G06N 7/01; G06N 10/20; G06N 10/40; G06N 10/70
See application file for complete search history.

(56) References Cited

U.S. PATENT DOCUMENTS

| | | | | |
|---|---|---|---|---|
| 5,345,174 A | * | 9/1994 | Kimmich ........... | G01R 33/4816 324/309 |
| 5,917,322 A | * | 6/1999 | Gershenfeld ...... | G01R 33/4625 324/307 |
| 2004/0051528 A1 | * | 3/2004 | Mor ................... | G01R 33/4608 324/300 |
| 2019/0020346 A1 | | 1/2019 | Wang et al. | |
| 2019/0245540 A1 | * | 8/2019 | Raeisi ................... | G06N 10/70 |
| 2019/0347574 A9 | | 11/2019 | Heeres et al. | |

OTHER PUBLICATIONS

International Search Report issued in related PCT Application No. PCT/CA2023/050655; search completed Aug. 24, 2023.

(Continued)

*Primary Examiner* — Thang X Le

(74) *Attorney, Agent, or Firm* — Own Innovation; James W. Hinton; Sanjeevan Shivakumar

(57) ABSTRACT

A method for signal suppression by increasing entropy in a system includes iteratively applying a set of electromagnetic (EM) pulses to the system, the set of EM pulses effecting swaps between the following pairs of system energy levels: a first system energy level in which the reset system is in a highest energy level and the target system is in a lowest target system energy level, and a corresponding second system energy level in which the reset system is in a highest energy level and the target system is in a highest target system energy level, and waiting a time period. This will suppress the signal of the target element. This for example can be a signal of a solvent in NMR.

20 Claims, 8 Drawing Sheets

300

310      320      330      340

(56) References Cited

OTHER PUBLICATIONS

Lloyd, Seth "A Potentially Realizable Quantum Computer", Science, vol. 261, Issue 5128, pp. 1569-1571, Sep. 17, 1993 (Sep. 17, 1993), downloaded from htt11s://doi.org/10.1126/science.261.5128.1569 on Aug. 21, 2023 (Aug. 21, 2023).

Duan, L-M. et al. "Pulse controlled noise suppressed quantum computation" arXiv.org, vl, pp. 1-12, Jul. 26, 1998 (Jul. 26, 1998), retrieved from htt11s://arxiv.org/abs/quant-11h/9807072 on Aug. 21, 2023 (Aug. 21, 2023).

European Search Report issued in related EP Patent Application No. 23806468; search completed Nov. 19, 2025.

Baugh, Jonathan et al.; "Experimental implementation of heat-bath algorithmic cooling using solid-state nuclear magnetic resonance", arxiv.org, Cornell University Library, 201 Olin Library Cornell University Ithaca, NY 14853, Dec. 2, 2005; XP080220012, DOI: 10.1038/NATURE04272.

Lloyd, Seth et al.: "A Potentially Realizable Quantum Computer", Science, vol. 261 Sep. 17, 1993 (Sep. 17, 1993), pp. 1569-1571, XP002909827, DOI: 10.1126/science.261.5128.1569.

* cited by examiner

210

: A CNOT Quantum Gate

200

220

Reset

600

Reset Polarization

Convergence/Cooling Rate

Acetic
Acid

700

METHOD FOR SIGNAL SUPPRESSION BY INCREASING ENTROPY AND QUANTUM ALGORITHM

CROSS-REFERENCE TO RELATED APPLICATION(S)

This application is a Continuation Application of PCT Application No. PCT/CA2023/050655 filed May 12, 2023, which claims priority to U.S. Provisional Patent Application No. 63/342,138 files on May 15, 2023, the contents of which are incorporated herein by reference in their entirety.

FIELD

The present disclosure relates to a method of suppressing the signal of an element in a quantum system by increasing entropy.

BACKGROUND

Quantum technologies are growing at an unprecedented pace. What is now referred to as the "second quantum revolution" (see www.nist.gov/topics/physics/introduction-new-quantum-revolution/second-quantum-revolution) is changing the face of modern technology, from communication to computation and sensing.

One of the main challenges that limit the applications of quantum technologies in real life is that it is extremely difficult to isolate elements of interest in quantum systems from their environment. For real applications, quantum systems are often complex and may involve too many unwanted elements.

Different techniques have been developed for isolating the evolution of quantum elements of interest and preserving them from the interaction with their environment. However, for measurement, these unwanted elements may still generate signals that could shadow the desired signal from elements of interest and in some sense, reduce the resolution.

For instance, in spin systems, techniques such as error correction, dynamical decoupling, and composite pulses have been exploited to preserve the state of the spin. But for measurement, one would still get the signal from unwanted spins in the system. These measurements, which often are spectroscopic measurements, could easily become complex for large systems. For example, for nuclear magnetic resonance (NMR) with large molecules, the spectrum often involves too many overlapping peaks, each of which is generated by an element or spin in the molecule. However, one is usually only interested in a few of the elements or a subset of the peaks.

The same problem has been explored in NMR spectroscopy, prior to quantum technologies. For instance, for liquid-state NMR, different ideas have been proposed to suppress the signal of the solvent.

Similarly, for magnetic resonance imaging (MRI), it is of interest to turn off the signal of specific molecules while keeping the signal of other molecules intact. This is of great significance for specificity of the scans.

SUMMARY OF THE INVENTION

The present disclosure describes a method for signal suppression of some target element(s) in a quantum system by increasing the entropy of the target element(s). The disclosed method is state-independent making it practical in real-world applications.

In one aspect, there is provided a method for increasing entropy in a system comprising a target system having two energy states and having a first relaxation time, and a reset system having two different energy states and having a second relaxation time that is shorter than the first relaxation time, the system having a set of system energy levels that includes the possible combinations of target system energy levels and the reset system energy levels, the method comprising: iteratively applying a set of electromagnetic (EM) pulses to the system to effect swaps between a) a first system energy level in which the reset system is in a highest energy level of the set of reset system energy levels (i.e. reset excited state) and the target system is in a lowest target system energy level (i.e. target ground state) and b) a corresponding second system energy level in which the reset system is in a highest energy level (i.e. reset excited state) of the set of reset system energy levels and the target system is in a highest target system energy level (i.e. target excited state), and waiting a time period that is on the order of the second relaxation time and shorter than the first relaxation time to facilitate at least some of the reset elements of the reset system resetting from the highest energy state.

In an implementation, the target system comprises one or more target elements, each target element having the first relaxation time, the target system further having a set of target system energy levels; and the reset system comprises one or more reset elements, each reset element having the second relaxation time that is shorter than the first relaxation time, the reset system further comprising the set of reset system energy levels; the system comprises a set of system energy levels that includes all possible combinations of target system energy levels and reset system energy levels.

In another aspect, there is provided a computer readable medium comprising computer executable instructions that, when executed, cause a computing device to perform the method.

In another aspect, there is provided a computing device comprising a processor and memory, the memory comprising computer executable instructions that, when executed by the processor, cause the device to perform the method.

BRIEF DESCRIPTION OF THE DRAWINGS

Embodiments of the present disclosure will now be described, by way of example only, with reference to the attached figures.

DETAILED DESCRIPTION

Figure 1:
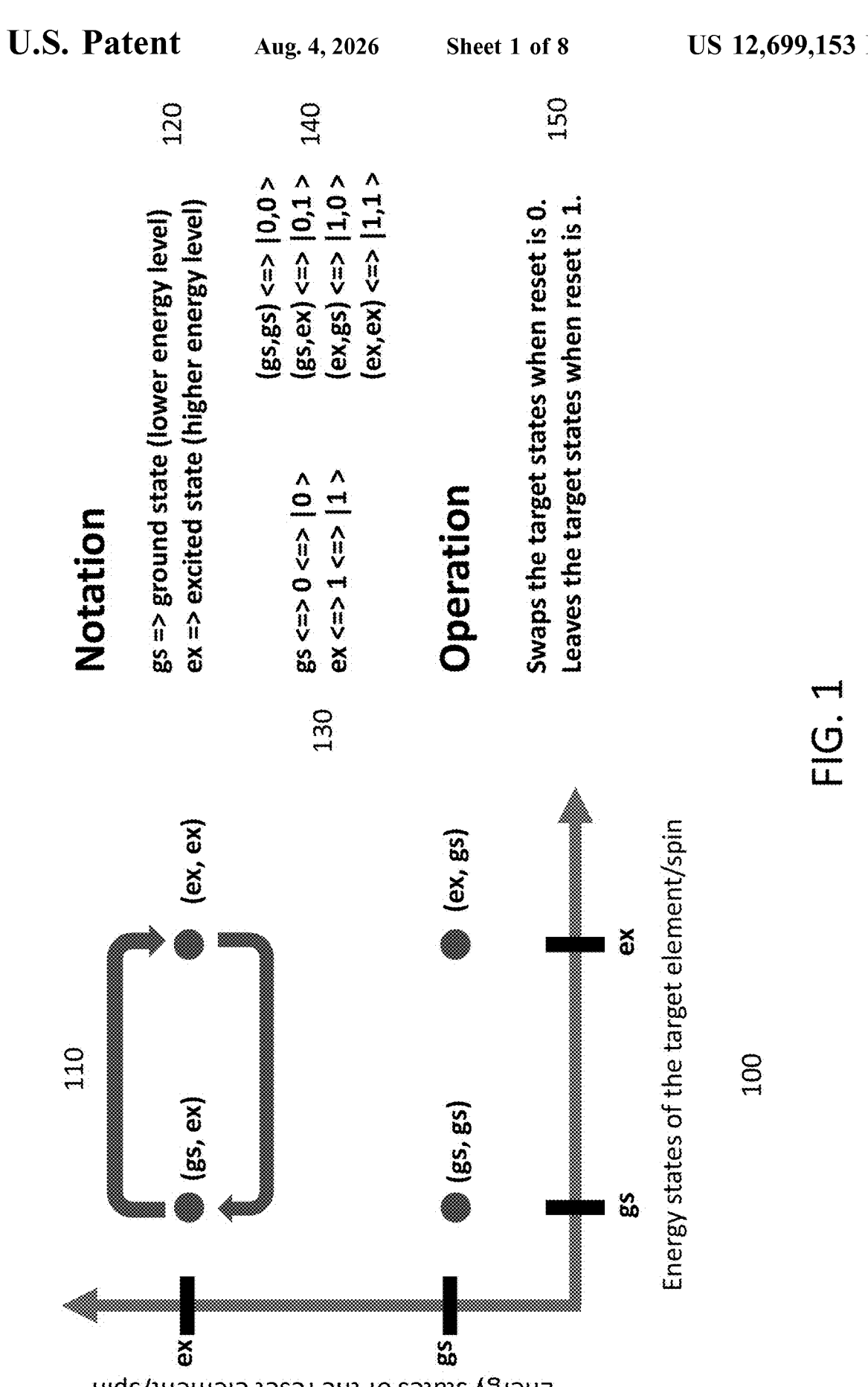
FIG. 1 is a schematic diagram illustrating the energy levels of the target system and the reset system and illustrating a process for increasing entropy in a system for one iteration according to an embodiment.

In a quantum system, it is recognized that it would be advantageous to have the ability to turn off unwanted elements of the system for the measurement and focus only on the elements that are relevant to our application.

The current disclosure proposed a method that makes this possible by providing a technique to suppress the signal of any element in the quantum system (e.g., elements in a molecule or quantum bits in a quantum computer) by increasing the entropy of unwanted elements. This is in contrast to prior methods used to decrease the entropy in quantum systems (see U.S. Pat. No. 10,560,096 incorporated herein by reference).

That is, the present disclosure describes a method for increasing the entropy of a quantum system, which can be used for suppressing the signal of unwanted elements in the system.

The disclosed method is state-independent, making it practical in real world applications. This means that the presently disclosed method is not affected by the imperfections that influence the state in the system in the middle of the process.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described.

"Quantum system", (also referred herein simply as the "system"), as used in this disclosure means a physical system having discrete energy levels, referred to as the system energy levels. Quantum systems include systems that may be considered classical systems or quasi-classical systems, such as for example NMR samples.

The system includes a target system and a reset system. The target system is the element whose signal is to be suppressed. The target system includes one or more target elements and the reset system includes one or more reset elements, wherein the reset elements have a relaxation time that is shorter than the relaxation time of the target elements. Usually, the reset elements may have a relaxation time that is an order of magnitude shorter than the relaxation time of the target elements. However, in some applications the relaxation time of the reset elements may be, for example, a third or some other fraction of the relaxation time of the target elements, which is determined based on the implementation setting and the desired final precision. The target elements and the reset elements may be any of size, for example, spin ½ particles, or a multilevel quantum system. Multilevel quantum systems include elements that have more than two state or energy levels. Multilevel quantum systems may include, for example, spin 1 particles, and nitrogen vacancy (nv) centers.

The target system has a number of target system energy levels and the reset system includes a number of reset system energy levels. For example, when the target elements and reset elements comprise non-zero spin particles, placing the system in a magnetic field will cause the different states of the target system and the reset system to split into target system energy levels and reset system energy levels, respectively. Each state of the system has an associated system energy level. Similarly each target system state and reset system state has, respectively, an associated target system energy level and an associated reset system energy level. In this disclosure, "state" and "energy level" may be used interchangeably.

Referring to FIG. 1, a schematic diagram illustrating the various energy levels of the target and reset system 100 is provided. The arrows of each axis represents increasing energy such that the energy states shown closer to the bottom of FIG. 1 are lower in energy for the reset system compared to the energy states shown above. Similarly, the energy states shown closer to the left of FIG. 1 are lower in energy for the target system compared to the energy states shown at the right. The notation utilized in FIG. 1 labels the ground state, or lowest energy state, |0>, followed by the excited state or the highest energy state, |1>. The combination of all possible target system energy levels and reset system energy levels gives all possible system energy levels for the overall system.

Disclosed herein is a method that increases entropy in the system by iteratively performing a pre-determined set of permutation operations on pairs of the system energy states. The set of permutation operations may be performed in the system by applying a set of electromagnetic (EM) pulses to the system.

For simplicity, we describe the method for a target element comprising two energy states and a reset element comprising two energy states. This could for instance include spin ½ particles or qubits for the target or for the reset system.

As set out below, it is shown that the entropy converges to its maximum, if the state of the reset element is flipped/changed only when the target element is in its higher energy state.

This can also be described as a swap operation that is performed between a pair of energy states that comprise a first system energy level in which the reset system is in the highest energy level of the set of reset system energy levels and the target system is in the highest energy level of the set of target system energy levels, and a corresponding second quantum system energy level in which the reset system is in the highest energy level of the set of reset system energy levels and the target system is in the lowest energy level of the set of target system energy levels.

The EM pulses that effect such permutation operations may be determined based on the difference in energy between the system energy levels of each pair, which may be determined by, for example, spectroscopy performed on the system. For example, each permutation operation may have a corresponding EM pulse that has a frequency corresponding to the difference in energy of the energy levels swapped by the permutation operation. In other examples, the permutation operation may be associated with more than one EM pulse (or a "sequence of pulses") such that the permutation operation is performed via one or more intermediary states of the system energy levels, with the end result being that the desired swap operation is performed between the desired pair of system energy levels. The EM pulses that are applied may be IT-pulses.

The number of times, or iterations, that the set of EM pulses are applied in order to reach convergence may be determined by, for example, the desired accuracy and precision of the operations. The number of iterations may be a predetermined number of iterations which relates to the number of iterations that are predicted for the system to reach a desired fidelity or for the system to vary from the ideal state by an amount that is less than or equal to a predetermined amount. Alternatively, or additionally, the system may be monitored such that the set of EM pulses are applied until the system is determined to have reached the desired fidelity or to vary from the ideal state by an amount less than or equal to a predetermined amount. The ideal state may be the maximally mixed state (MMS).

The full process including multiple iterations, may be described by a time-homogeneous Markov process. In the following description, the transfer matrix of the process is found and the spectrum of the transfer matrix is calculated. The spectrum is then utilized to show that applying the transfer matrix to the system converges to the MMS and to provide an upper-limit for the number of iterations that results in convergence.

The following description of the disclosed technique utilizes a system comprising an ensemble of 2 elements or qubits, in which the first element or qubit forms the target system, and the second element or qubit forms the reset system, i.e., is the reset qubit.

The heating operation entangles the state of the target and the reset systems. After the heating operation, the reset system interacts with a heat-bath which results in losing the information that was transferred to the reset system from the target system. This increases the entropy of the target system.

Mathematically the reset step may be described as $R[\rho]=Tr_R(\rho_{T,R})\otimes\rho_R$, where $Tr_R$ is the partial trace over the reset element and $\rho_{T,R}$ is the density matrix describing the quantum state of the target element, and PR is the density matrix of the reset system and may be given by:

$$\rho_R = \frac{1}{z}\begin{pmatrix} e^\epsilon & 0 \\ 0 & e^{-\epsilon} \end{pmatrix} \qquad \text{(Eq. 1)}$$

with $z=(e^\epsilon+e^{-\epsilon})$. The parameter $\epsilon$ is called the polarization and $$\epsilon = \frac{\delta}{2K_bT_B}$$

with $\delta$ the energy gap between the states of the reset element, $K_b$ the Boltzmann constant, and $T_B$ the bath temperature.

One can also use $\rho_T$ to refer to the state of the target element or quibt. Generally, the subscript R refers to the reset element or qubit and T to refer to the target element or qubit.

The heating operation is given by a two-qubit unitary operation that acts on the target and the reset elements. It is assumed that the Hilbert space is structured as $H_T\otimes H_R$, i.e., the first part is the target element and the second part is the reset element.

In the technique described in the present disclosure, one can apply the following unitary in each iteration:

$$U_{CNOT} = \begin{pmatrix} 1 & 0 & 0 & 0 \\ 0 & 0 & 0 & 1 \\ 0 & 0 & 1 & 0 \\ 0 & 1 & 0 & 0 \end{pmatrix}.$$

The matrix $U_{CNOT}$ is called a CNOT operation that uses the reset element as the control bit and flips/changes the state of the target only when the reset element is in the highest energy (excited) state.

The method is comprised of repeating a fixed iteration.

Each iteration is composed of first resetting the reset element, and second applying the $U_{CNOT}$ to the full system.

Figure 2:
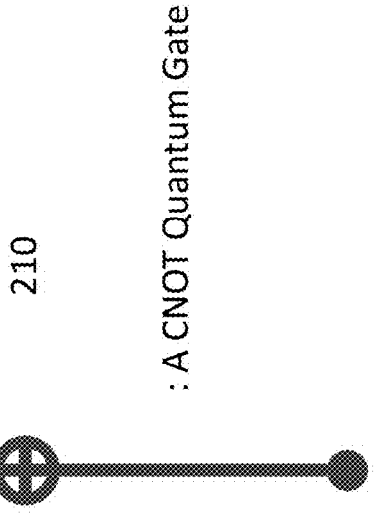
FIG. 2 is a schematic diagram illustrating an example circuit for implementing the method of increasing entropy according to the embodiment shown in FIG. 1.
Figure 2:
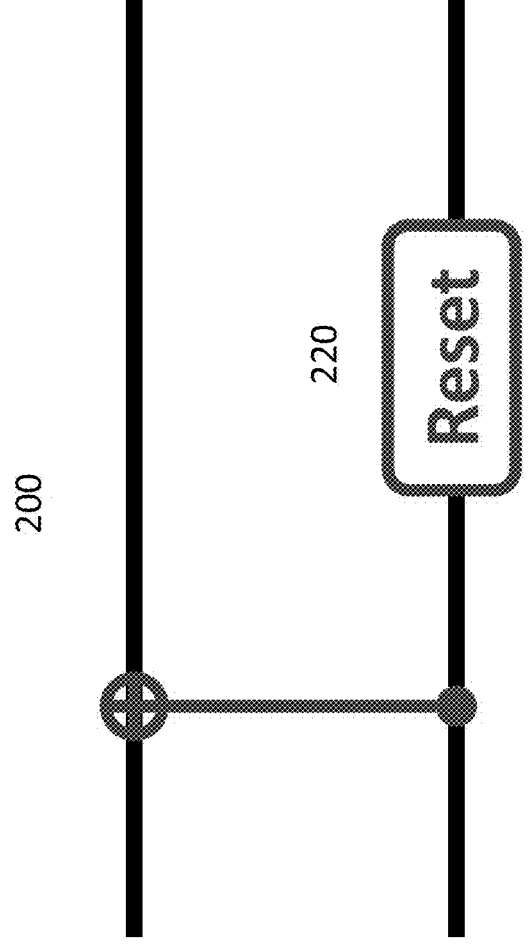

Referring to FIG. 2, a schematic diagram illustrating the quantum circuit corresponding to the process of a single iteration is depicted. Each line in the process 200 indicates one spin or quantum bit, the first line is the target spin or quantum bit and the second line indicates the reset. The process 200 begins with a CNOT gate 210 and is followed by a reset 220. The CNOT quantum gate 210 uses the second spin or quantum bit as the control bit and operates on the target spin or quantum bit.

Mathematically each iteration applies the following operation (or quantum channel) on the full density matrix $$C[\rho_{T,R}] = U_{CNOT}^\dagger(Tr_R(\rho_{T,R})\otimes\rho_R)U_{CNOT}.$$

Note that starting from the thermal/equilibrium state, this process keeps the density matrix of the full system diagonal.

Similarly, starting from any diagonal state for density matrix of the full system, the process keeps the density matrix of the system diagonal.

This means that the diagonal elements of the density matrix can provide a more compact representation of the quantum state. One can use $\{\lambda^t\}=\text{Diag}(\rho_{T,R})$ for the diagonal elements of the full system in the $t^{th}$ iteration and $\{p^t\}=\text{Diag}(\rho_T)$ for the diagonal elements of the target system in the $t^{th}$ iteration.

This process is independent of the iteration or the state of the target and reset elements, resulting in a time-homogeneous Markov process. The sequence of the elements on the diagonal of the density matrix form a Markov chain. $\{p^t\}$ represents the $t^{th}$ link of the chain for the state of the target element. Each link is a vector with 2 elements.

Figure 3:
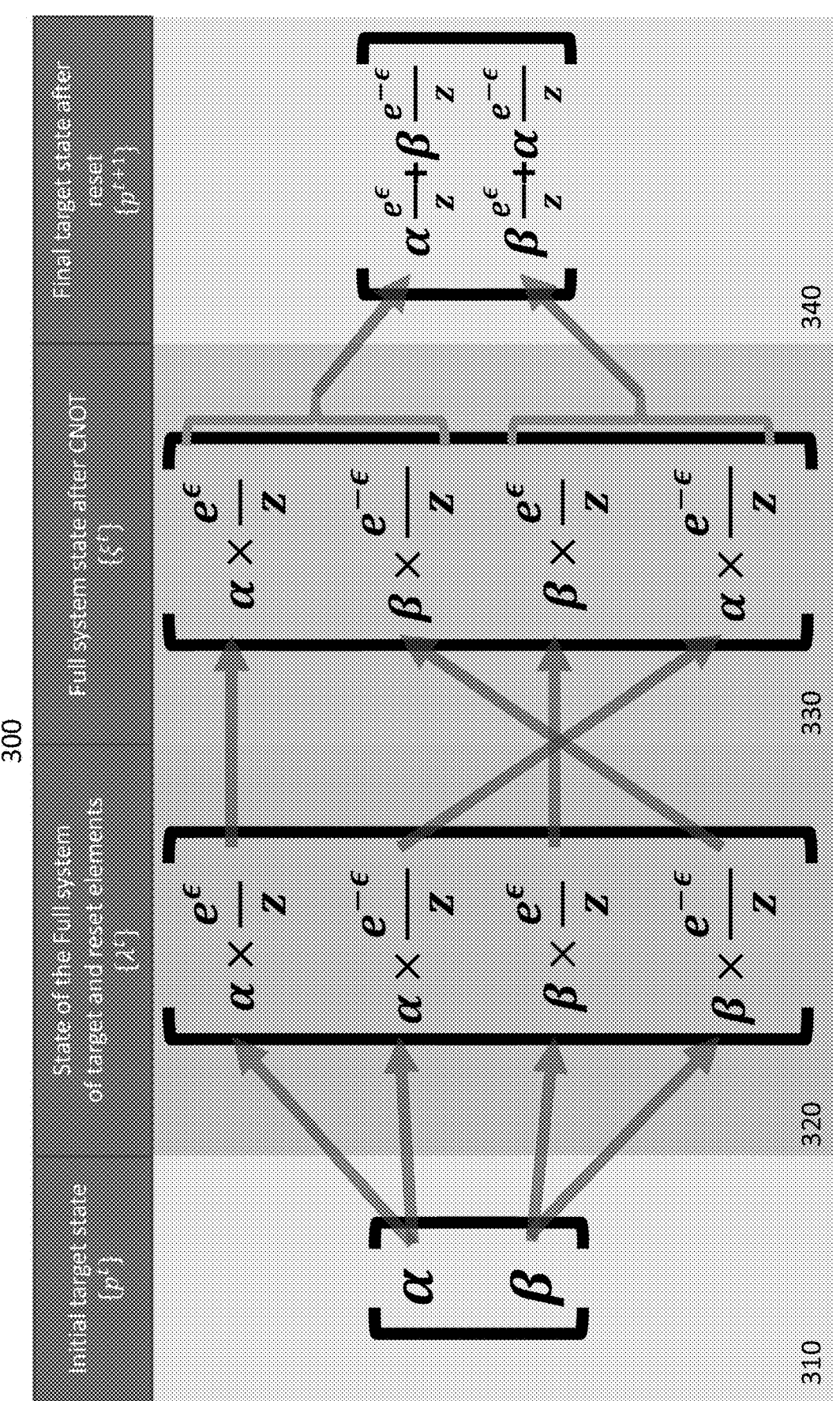
FIG. 3 is a schematic diagram illustrating the process that occurs during each iteration.

Referring to FIG. 3, a schematic diagram 300 illustrating the process that occurs during each iteration is shown. The process 300 begins with the sequence $\{p^t\}$, i.e. 310 which are the diagonal elements of the density matrix of the target element. Specifically, in the vector $$\begin{bmatrix} \alpha \\ \beta \end{bmatrix},$$

$\alpha$ gives the probability of the target element being in the ground state (target energy state with lower energy) and $\beta$ gives the probability of the target element being in the excited state (target energy state with higher energy). This gives the full state 320 which is the combined state of the energy states of the target element and the reset element after a reset and is represented with $\{\lambda^t\}$. Note that the full state of the system is needed for the CNOT which operates on both the target and the reset elements. Next, the operation, $U_{CNOT}$ is applied to the state, i.e 330. As illustrated in 330, the $U_{CNOT}$ swaps the second and last element of $\{\lambda^t\}$ and leaves the first and the third elements of $\{\lambda^t\}$ unchanged. The result of the application of $U_{CNOT}$ operation is represented by $\{\xi^t\}$. After the CNOT, the reset element is reset which leads to the state in 340 for the final state of the target element after the iteration. This concludes the iteration. 340 shows the reduced state of the target element for the new iteration, i.e. $\{p^{t+1}\}$. This is equivalent to $\rho_T=Tr_R(\rho_{T,R})$. The first element of the target state is the sum of the first two elements of the state of the full system from 330, i.e. $\{\xi^r\}$ and the second element of the target state is the sum of the two last elements of the state of the full system from 330, i.e. $\{\xi^r\}$.

For simplicity, focus may be placed on the target element or qubit and the reset qubit may be traced out, meaning that the total probability for that system qubit state is computed by summing over all the possible corresponding reset qubit states. The result of tracing out the reset qubit is the following update rule for the diagonal elements of the target element:

$$\{p^{r+1}\} = \begin{pmatrix} \alpha\dfrac{e^\epsilon}{z} + \beta\dfrac{e^{-\epsilon}}{z} \\[2mm] \beta\dfrac{e^\epsilon}{z} + \alpha\dfrac{e^{-\epsilon}}{z} \end{pmatrix} = \frac{1}{z}\begin{pmatrix} e^\epsilon & e^{-\epsilon} \\ e^{-\epsilon} & e^\epsilon \end{pmatrix}\begin{pmatrix} \alpha \\ \beta \end{pmatrix} = \frac{1}{z}\begin{pmatrix} e^\epsilon & e^{-\epsilon} \\ e^{-\epsilon} & e^\epsilon \end{pmatrix}\{p^r\} \qquad \text{(Eq. 2)}$$

This update rule gives the following transition matrix for the Markov process:

$$T = \frac{1}{z}\begin{pmatrix} e^\epsilon & e^{-\epsilon} \\ e^{-\epsilon} & e^\epsilon \end{pmatrix}.$$

It can be verified that $\{p^{r+1}\}=T. \{p^r\}$ is the update rule in Eq. 2.

The spectrum of the transfer matrix may be utilized to show that the Markov chain converges to the MMS. T has two eigen values. One of them is $\lambda_1=1$ and the other one is $-\lambda_2=\tan h\ \epsilon$. It is easy to check that $|\lambda_2|\le 1$. The eigenstate corresponding to eigenvalue one is:

$$\{p^\infty\} = \frac{1}{2}\begin{pmatrix} 1 \\ 1 \end{pmatrix},$$

which is equal to the MMS. Because the other eigenvalue is smaller than one in magnitude, i.e. $|\lambda_2|\le 1$ the Markov chain asymptotically converges to $\{p^\infty\}$.

Thus, in the above-described process, iteratively applying the same set of permutation operations to the system, followed by resetting the reset elements, results in the system converging to the MMS in a manner that is independent of the state of the system at any iteration.

Figure 4:
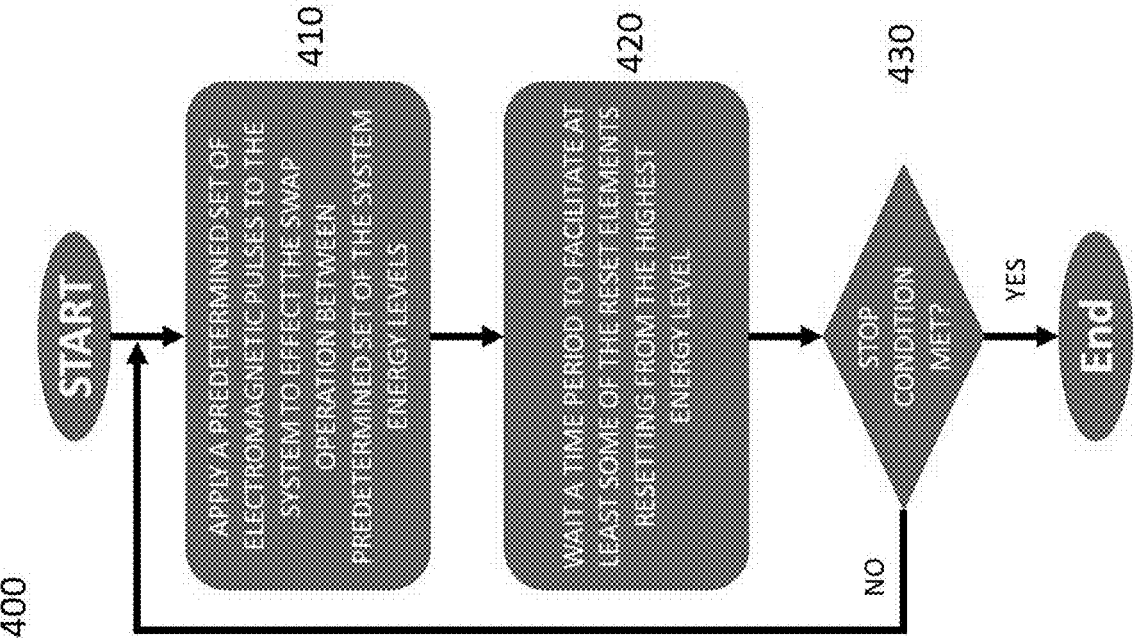
FIG. 4 is a flow chart illustrating a method for increasing entropy in a system according to an embodiment shown in FIG. 1 and the circuit of FIG. 2.
Figure 8:
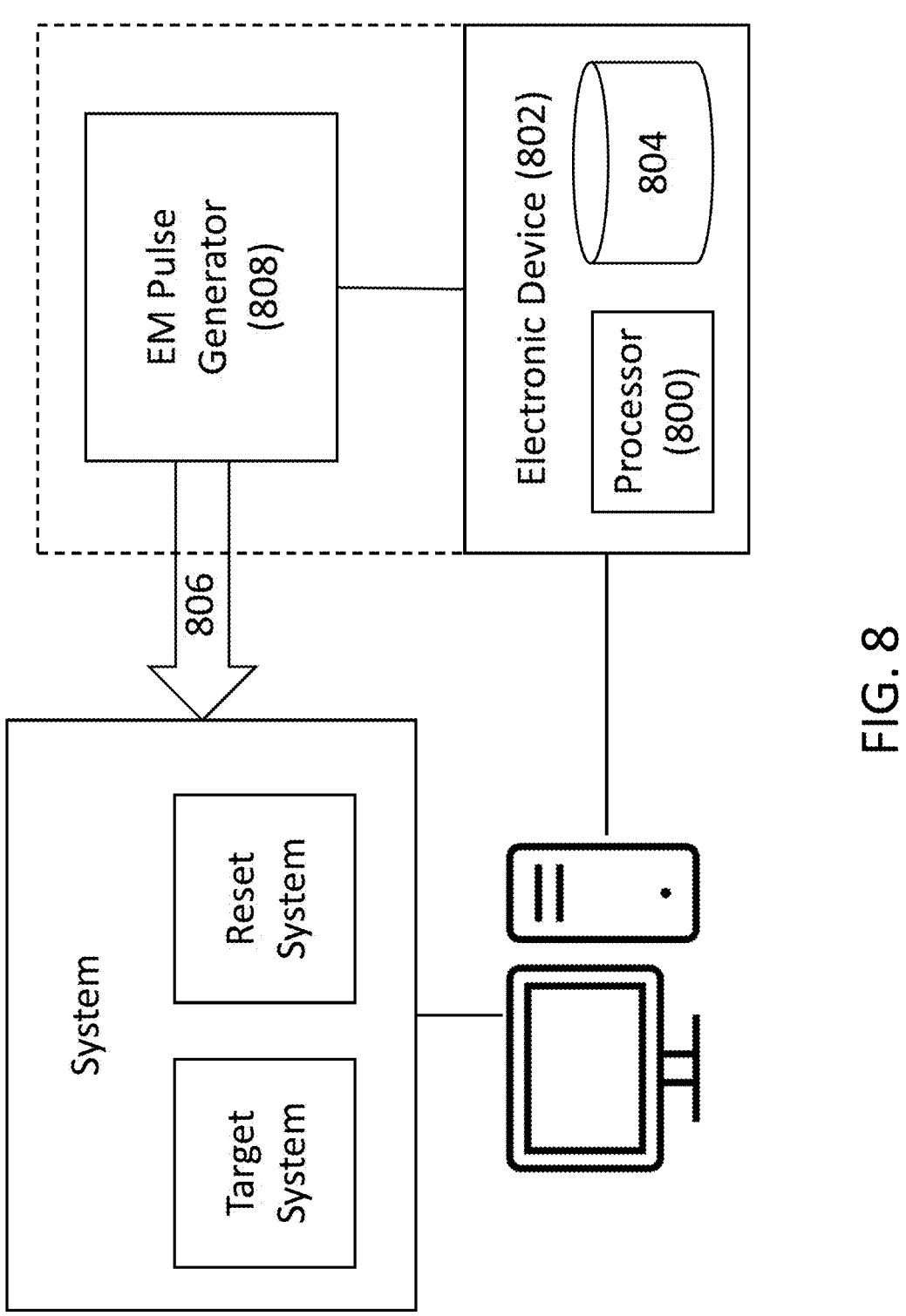
FIG. 8 illustrates an example configuration for a device to implement the processes described herein.

Referring now to FIG. 4, a flow chart illustrating a method for increasing entropy in a system is shown. The method may be carried out by software executed, for example, by a processor as shown in FIG. 8. Coding of software for carrying out such a method is within the scope of a person of ordinary skill in the art given the present description. The method may contain additional or fewer processes than shown and/or described, and may be performed in a different order. Computer-readable code executable by at least one processor 800 of an electronic device 802 to perform the method may be stored in a computer-readable storage medium 804, such as a non-transitory computer-readable medium. The device 802 may also be configured to apply or to initiate the application of EM pulses 806 as herein described, e.g., via an EM pulse generator 808.

At 410, a set of predetermined EM pulses are applied to a system to effect the swap between predetermined pairs of energy levels of the system. As described above, the system includes a target system comprising one or more target elements and a reset system comprising one or more reset elements. The reset elements have a relaxation time that is shorter than the relaxation time of the target elements. The target elements and the reset elements may be any of, for example, spin ½ particles, or a multilevel quantum system which include, for example, electrons, spin 1 particles, and nitrogen vacancy (nv) centers.

The target system has a number of target system energy levels and the reset system includes a number of reset system energy levels. The combination of all possible target system energy levels and reset system energy levels gives all possible system energy levels for the overall system.

The predetermined set of EM pulses effect the swap operation between pairs of system energy levels, each pair including a first quantum system energy state in which the reset system is in the highest reset system energy level, i.e., the reset system is in an excited state, and the target system is in the lowest target system energy, i.e., the target system is in the ground state, and a corresponding second quantum system energy level in which the reset system is in the highest reset system energy level and the target system is in the highest target system energy, i.e., the target system is in the excited state.

As discussed previously, the frequencies of the EM pulses that effect such swap operations may be determined based on the difference in energy between the system energy levels between the states corresponding to the swap. The difference in energy associated with each pair of system energy levels may be determined by, for example, spectroscopy measurements performed on the system. Each swap operation may be associated with one EM pulse of the set of pulses or may be associated with multiple EM pulses. For example, multiple EM pulses may be applied such that the swap operation is effected via intermediary system energy levels. Further, because the EM pulses are determined based on an energy difference between the states corresponding to the swap, it is possible that a single EM pulse may be associated with multiple pairs of system energy levels if the multiple pairs of system energy levels are separated by the same energy difference. The EM pulses may be IT-pulses.

The set of EM pulses applied at 410 may be applied simultaneously or may be applied sequentially, or a portion may be applied simultaneously while another portion is applied sequentially.

After the predetermined set of EM pulses are applied at 410, a time period elapses at 420 to facilitate at least some of the reset elements resetting from the highest reset system energy level to a lower reset system energy level. The time period that elapses may be on the order of the relaxation time of the reset system, which is much shorter than the relaxation period of the target system. In this way, the reset elements reset between iterations of applying the set of EM pulses while the target elements do not have time to reset in a significant amount.

In some embodiments, the relaxation time of the reset system may be an effective relaxation time that is shorter than an intrinsic relaxation of the reset system. The effective relaxation time may be the result of manipulating the reset system to reduce the relaxation time from the intrinsic relaxation time to the effective relaxation time. For example, manipulating the reset system may include performing, for example, optical polarization, optical pumping, or dynamic nuclear polarization during the time period that elapses at 420.

At 430, a determination of whether a stop condition has been met is made. The stop condition may be, for example, a predetermined number of iterations. In another example, the stop condition may be the system reaching a particular state. For example, reaching a state in close vicinity of the MMS or after a certain amount of time. The vicinity may be determined by the precision and quality of the EM pulses and other factors that may affect the fidelity of the states.

If the stop condition is determined not to be met at 430, the process returns to 410, and the predetermined set of EM pulses is applied again, followed by waiting a time period at 420. If the stop condition is determined to be met at 430, then the process ends.

Figure 5:
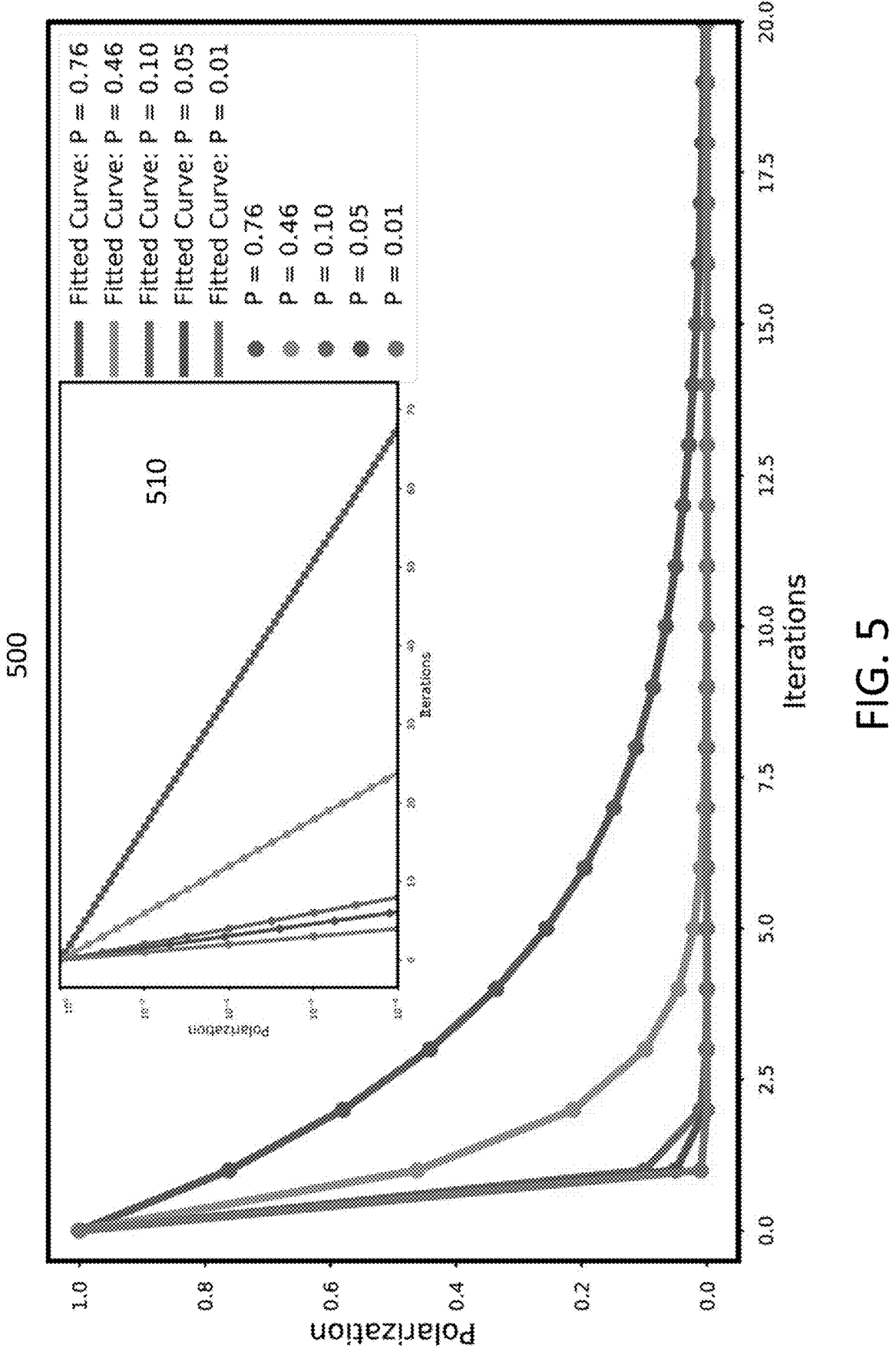
FIG. 5 is a computer simulation illustrating the change in signal (i.e. polarization) of the target element according to the embodiment shown in FIG. 1 and the circuit of FIG. 2.

FIG. 5 shows the result of the simulation of the above-described process for a target system starting from $$\{p^0\} = \begin{pmatrix} 1 \\ 0 \end{pmatrix},$$

i.e. a fully polarized or pure state. The y-axis shows the difference between the two elements of $\{p'\}$ which is the difference between the probability of the ground state and excited state of the target element. The x-axis shows the iterations. The plot shows that process converges to target state where the two energy states (ground state and excited state) are equally probably which is the MMS. Note that the MMS is the ideal output of the process because the target element does not generate any signal when it is in the state given by MMS. 410 shows the same plots on a log scale. This indicates that the convergence of the method is exponentially fast.

Figure 6:
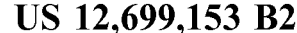
FIG. 6 is a computer simulation illustrating the convergence rate of the process in FIG. 4, according to the embodiment shown in FIG. 1 and the circuit of FIG. 2.

FIG. 6 shows the dependence of the convergence rate on the reset polarization. It shows that the higher the reset polarization, the slower the convergence. It indicates that a reset element with lower reset polarization would be more effective for the heating process.

Embodiments of the present disclosure provide a method for increasing entropy in a system having a target system and a reset system in a way that is independent of the state of the system. The method utilizes a predetermined set of EM pulses that effect permutation operations between pairs of system states. Each pair of system states includes a first quantum system energy state in which the reset system is in the highest reset system energy level, and the target system is in the lowest target system energy, and a corresponding second quantum system energy level in which the reset system is in the highest reset system energy level and the target system is in the highest target system energy.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The below-described embodiments are intended to be examples only. Alterations, modifications and variations can be effected to the particular embodiments by those of skill in the art without departing from the scope, which is defined solely by the claims appended hereto.

Example Embodiment I: Solvent Suppression for Liquid-State NMR

For applications of liquid-state NMR, the sample is dissolved in a solvent. The solvent generates its own signal that could interfere with the signal of the sample. The method presented here can be used to suppress the signal.

Figure 7:
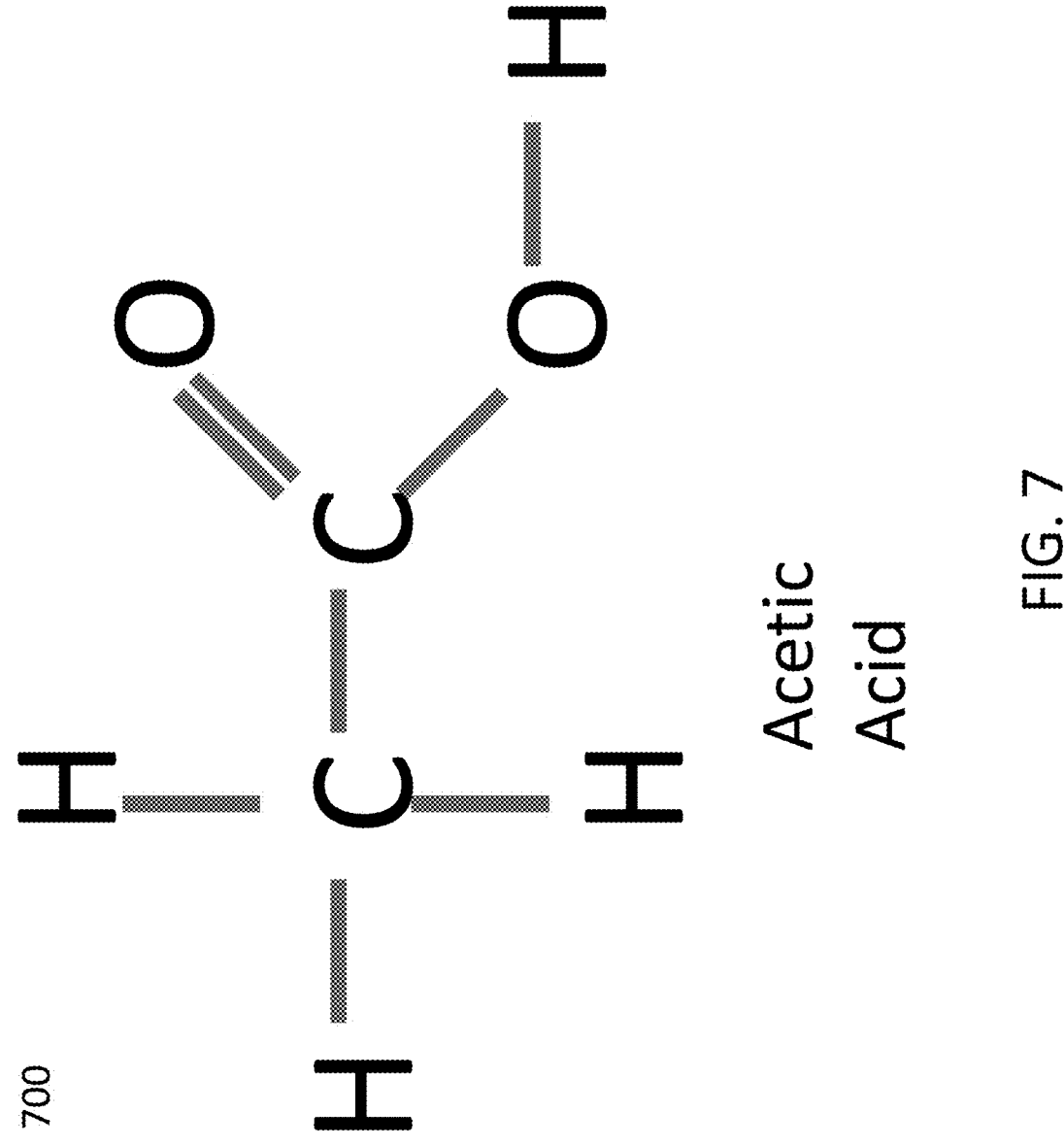
FIG. 7 shows the chemical structure of Acetic Acid.

As a specific example, we consider Acetic Acid which is one of the commonly used solvents for liquid-state NMR. The Acetic Acid generates signals both on the proton channel and on the Carbon channel. FIG. 7 shows the chemical structure of Acetic Acid.

The Carbons ($^{13}C$) are coupled to the Hydrogens ($^1H$). Each Carbon or Proton has two energy states, a lower energy level (the ground state) and a higher energy level (the excited state). Based on the application, one may need to remove the signal of the Carbons or the Hydrogens. Imagine that is desired to remove the signal of Carbons ($^{13}C$). In this case, one can set the Hydrogens ($^1H$) as the reset and the Carbons ($^{13}C$) as the target. After a few iterations, the Carbon converges to a state with no signal.

Example Embodiment II: Signal Suppression for MRI

For MRI, the signal is usually collected from Hydrogen Nuclear spins. However, this sometimes is not specific enough because different molecules such as fat and water can generate signals that overlap.

The method of the present disclosure can be used to suppress the signal of one while not changing the signal of the other. For instance, we can use the Carbon and Hydrogens in the fat as the reset and target respectively and suppress the signal of the fat while keeping the signal of the water.

Example Embodiment III: Signal Suppression for Quantum Devices

For some quantum technologies such as Superconducting Circuits that are used for quantum computers or Nitrogen-Vacancy centers that are used for quantum sensing, there are unwanted elements such as defects from fabrication or nuclear spins that generate signals that interfere with the actual signal.

In such cases, the method presented here can suppress the signal of the defect. The defect will be treated as the target and a controllable element in the quantum system or device is used as the reset. Applying the method will diminish the signal of the defect.

APPENDIX

The convergence rate is determined by the difference between $\lambda_1=1$ and the second largest eigenvalue, $$\lambda_2 = \frac{(e^\epsilon - e^{-\epsilon})}{(e^\epsilon + e^{-\epsilon})}.$$

One can bound the gap as $$\Delta = 1 - \frac{(e^\epsilon - e^{-\epsilon})}{(e^\epsilon + e^{-\epsilon})} = \frac{2e^{-\epsilon}}{(e^\epsilon + e^{-\epsilon})}.$$

The mixing time is then upper-bounded by $$t_{mix}(e) \le c\frac{1}{\Delta} \le c\left(\frac{e^\epsilon + e^{-\epsilon}}{2e^{-\epsilon}}\right) \le \frac{c}{2}\left(e^{2\epsilon} + 1\right),$$

where c is a constant. This gives the upperbound for the mixing time for the mixing time.

What is claimed is:

1. A method for increasing entropy in a system, wherein the system comprises:
   a target system having one or more target elements,
      each target element having a first relaxation time,
      the target system further having a set of target system energy levels; and
   a reset system having one or more reset elements,
      each reset element having a second relaxation time that is shorter than the first relaxation time,
      the reset system further having a set of reset system energy levels;
   the full system having a set of system energy levels that includes all possible combinations of target system energy levels and the reset system energy levels,
the method comprising:
   iteratively applying a set of EM pulses to the system to effect swaps between a) a first system energy level in which the reset system of the system is in a highest energy level of the set of reset system energy levels and the target system of the system is in a lowest target system energy level of the set of target system energy levels, and b) a corresponding second system energy level in which the reset system is in a highest energy level of the set of reset system energy levels and the target system is in a highest target system energy level of the set of target system energy levels; and
   waiting a time period that is on a order of the second relaxation time of a reset element and shorter than the first relaxation time of a target element, to facilitate at least some reset elements of the reset system resetting from the highest energy level.

2. The method of claim 1, wherein the target system comprises a plurality of target elements.

3. The method of claim 1, wherein the reset system comprises a plurality of reset elements.

4. The method of claim 1, wherein at least one target element is a spin.

5. The method of claim 4, wherein each target element is a multilevel quantum system.

6. The method of claim 5, wherein the multilevel quantum system is one of spin 1 particles and nitrogen vacancy (nv) centers.

7. The method of claim 1, wherein at least one reset element is a spin.

8. The method of claim 7, wherein each reset element is a multilevel quantum system.

9. The method of claim 8, wherein the multilevel quantum system is one of spin 1 particles and nitrogen vacancy (nv) centers.

10. The method of claim 1, wherein the target elements and the reset elements are spins.

11. The method of claim 10, wherein the target elements are comprised of a spin species different than the reset elements.

12. The method of claim 1, wherein one or both of the target elements and the reset elements are qubits.

13. The method of claim 1, wherein the set of EM pulses are applied to implement a sequence of quantum logic gates in order to effect swaps between the pairs of first quantum system energy levels and corresponding second quantum system energy levels.

14. The method of claim 13, wherein the quantum logic gates include a CNOT quantum gate with the reset element as a control.

15. The method of claim 1, wherein the second relaxation time is an effective relaxation time that is shorter than an intrinsic relaxation time of the reset elements.

16. The method of claim 1, wherein each iteration further comprises, during the waiting, manipulating the reset system to reduce the second relaxation time from the intrinsic relaxation time to the effective relaxation time.

17. The method of claim 16, wherein manipulating the reset system comprises performing one of optical polarization, optical pumping, and dynamic nuclear polarization.

18. The method of claim 1, wherein at least some of the pairs of first system energy levels and the corresponding second system energy levels correspond to one of entangled system states or non-diagonal system states.

19. A non-transitory computer readable medium comprising computer executable instructions that, when executed, cause a computing device to increase entropy in a system, wherein the system comprises:
   a target system having one or more target elements,
      each target element having a first relaxation time,
      the target system further having a set of target system energy levels; and
   a reset system having one or more reset elements,
      each reset element having a second relaxation time that is shorter than the first relaxation time,
      the reset system further having a set of reset system energy levels;
   the full system having a set of system energy levels that includes all possible combinations of target system energy levels and the reset system energy levels,
comprising computer-executable instructions for:
   iteratively applying a set of EM pulses to the system to effect swaps between a) a first system energy level in which the reset system of the system is in a highest energy level of the set of reset system energy levels and the target system of the system is in a lowest target system energy level of the set of target system energy levels, and b) a corresponding second system energy level in which the reset system is in a highest energy level of the set of reset system energy levels and the target system is in a highest target system energy level of the set of target system energy levels; and
   waiting a time period that is on a order of the second relaxation time of a reset element and shorter than the first relaxation time of a target element, to facilitate at least some reset elements of the reset system resetting from the highest energy level.

20. A computing device comprising a processor and memory, the memory comprising computer executable instructions that, when executed by the processor, cause the device to increase entropy in a system, wherein the system comprises:

a target system having one or more target elements, each target element having a first relaxation time, the target system further having a set of target system energy levels; and a reset system having one or more reset elements, each reset element having a second relaxation time that is shorter than the first relaxation time, the reset system further having a set of reset system energy levels;

the full system having a set of system energy levels that includes all possible combinations of target system energy levels and the reset system energy levels, comprising computer-executable instructions for:

iteratively applying a set of EM pulses to the system to effect swaps between a) a first system energy level in which the reset system of the system is in a highest energy level of the set of reset system energy levels and the target system of the system is in a lowest target system energy level of the set of target system energy levels, and b) a corresponding second system energy level in which the reset system is in a highest energy level of the set of reset system energy levels and the target system is in a highest target system energy level of the set of target system energy levels; and waiting a time period that is on a order of the second relaxation time of a reset element and shorter than the first relaxation time of a target element, to facilitate at least some reset elements of the reset system resetting from the highest energy level.

* * * * *